United States Patent
Kinney

(10) Patent No.: US 10,790,304 B2
(45) Date of Patent: Sep. 29, 2020

(54) INTEGRATED ASSEMBLIES COMPRISING FERROELECTRIC TRANSISTORS AND NON-FERROELECTRIC TRANSISTORS

(71) Applicant: Micron Technology, Inc., Boise, ID (US)

(72) Inventor: Wayne I. Kinney, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/046,803

(22) Filed: Jul. 26, 2018

(65) Prior Publication Data

US 2020/0035704 A1 Jan. 30, 2020

(51) Int. Cl.
*H01L 29/76* (2006.01)
*H01L 27/11597* (2017.01)
(Continued)

(52) U.S. Cl.
CPC ...... *H01L 27/11597* (2013.01); *G11C 11/223* (2013.01); *G11C 11/2273* (2013.01); *G11C 11/2275* (2013.01); *H01L 23/528* (2013.01); *H01L 27/1157* (2013.01); *H01L 27/1159* (2013.01); *H01L 27/11514* (2013.01); *H01L 27/11582* (2013.01); *H01L 27/11592* (2013.01); *H01L 29/0847* (2013.01); *H01L 29/1037* (2013.01); *H01L 29/42392* (2013.01); *H01L 29/6684* (2013.01); *H01L 29/78391* (2014.09)

(58) Field of Classification Search
CPC ......... H01L 27/11597; H01L 27/11592; H01L 29/0847; H01L 29/78391; H01L 27/1159; H01L 23/528; H01L 29/1037; H01L 29/42392; H01L 27/11582; H01L 27/1157; H01L 29/6684; H01L 27/11514; H01L 27/11578; H01L 27/11585; H01L 29/516

See application file for complete search history.

(56) References Cited

U.S. PATENT DOCUMENTS 6,975,531 B2 12/2005 Forbes
9,159,829 B1 10/2015 Ramaswamy
(Continued)

FOREIGN PATENT DOCUMENTS

KR 10-2010-0053230 5/2010

OTHER PUBLICATIONS

U.S. Appl. No. 15/974,141, filed May 8, 2018 by Karda et al.
(Continued)

*Primary Examiner* — Shouxiang Hu
(74) *Attorney, Agent, or Firm* — Wells St. John P.S.

(57) ABSTRACT

Some embodiments include an integrated assembly having a semiconductor structure extending from a first wiring to a second wiring. A ferroelectric transistor includes a first transistor gate adjacent a first region of the semiconductor structure. A first non-ferroelectric transistor includes a second transistor gate adjacent a second region of the semiconductor structure. The second region of the semiconductor structure is between the first region of the semiconductor structure and the first wiring. A second non-ferroelectric transistor includes a third transistor gate adjacent a third region of the semiconductor structure. The third region of the semiconductor structure is between the first region of the semiconductor structure and the second wiring.

26 Claims, 13 Drawing Sheets

(51) Int. Cl.
*H01L 27/11592* (2017.01)
*H01L 23/528* (2006.01)
*H01L 27/1159* (2017.01)
*G11C 11/22* (2006.01)
*H01L 29/78* (2006.01)
*H01L 29/10* (2006.01)
*H01L 29/08* (2006.01)
*H01L 29/66* (2006.01)
*H01L 29/423* (2006.01)
*H01L 27/1157* (2017.01)
*H01L 27/11514* (2017.01)
*H01L 27/11582* (2017.01)

(56) References Cited

U.S. PATENT DOCUMENTS

| | | | |
|---|---|---|---|
| 9,263,577 | B2 | 2/2016 | Ramaswamy et al. |
| 9,281,044 | B2 | 3/2016 | Ramaswamy et al. |
| 9,337,210 | B2 | 5/2016 | Karda et al. |
| 2002/0131304 | A1 | 9/2002 | Ogura et al. |
| 2004/0046210 | A1 | 3/2004 | Kang et al. |
| 2004/0061153 | A1 | 4/2004 | Misewich et al. |
| 2006/0114719 | A1 | 6/2006 | Lee |
| 2009/0003062 | A1 | 1/2009 | Park et al. |
| 2009/0290404 | A1 | 11/2009 | Kaneko et al. |
| 2013/0207178 | A1 | 8/2013 | Lee et al. |
| 2014/0057398 | A1 | 2/2014 | Tang |
| 2014/0340952 | A1 | 11/2014 | Ramaswamy et al. |
| 2015/0041873 | A1 | 2/2015 | Karda et al. |
| 2015/0310905 | A1 | 10/2015 | Karda et al. |
| 2016/0247932 | A1 | 8/2016 | Sakai et al. |
| 2017/0309322 | A1 | 10/2017 | Ramaswamy et al. |
| 2017/0358598 | A1* | 12/2017 | Bedeschi .......... H01L 27/11597 |
| 2018/0061481 | A1 | 3/2018 | Kawamura et al. |
| 2018/0061834 | A1 | 3/2018 | Derner et al. |
| 2018/0350823 | A1 | 12/2018 | Or-bach et al. |
| 2019/0252407 | A1* | 8/2019 | Bedeschi ............ H01L 27/1157 |

OTHER PUBLICATIONS

Boscke et al., "Ferroelectricity in Hafnium Oxide: CMOS Compatible Ferroelectric Field Effect Transistors", IEEE IEDM11-547, 2011 United States, 4 pages.

Colinge et al., "Nanowire Transistors Without Junctions", Nature Nanotechnology, Feb. 21, 2010, United Kingdom, pp. 225-229.

Ishiwara, "Current Status and Prospects of FET-Type Ferroelectric Memories", IEEE Future of Electron Devices Journal vol. 11 Supplement, 2000, United States, pp. 27-40.

WO PCT/US2019/042875 Search Rept., dated Nov. 8, 2019, Micron Technology, Inc.

WO PCT/US2019/042875 Writ. Opin., dated Nov. 8, 2019, Micron Technology, Inc.

* cited by examiner

INTEGRATED ASSEMBLIES COMPRISING FERROELECTRIC TRANSISTORS AND NON-FERROELECTRIC TRANSISTORS

TECHNICAL FIELD

Integrated assemblies comprising ferroelectric transistors and non-ferroelectric transistors.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bitlines, data lines, sense lines, or data/sense lines) and access lines (which may also be referred to as wordlines). The digit lines may conductively interconnect memory cells along columns of the array, and the access lines may conductively interconnect memory cells along rows of the array.

Memory cells may be volatile or nonvolatile. Nonvolatile memory cells can store data for extended periods of time including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

Ferroelectric field effect transistors (FeFET) may be utilized as memory cells. Specifically, the FeFETs may have two selectable memory states corresponding to two different polarization modes of ferroelectric material within the FeFETS. The different polarization modes may be characterized by, for example, different threshold voltages (Vt) or by different channel conductivities for a selected operating voltage. The ferroelectric polarization mode of a FeFET may remain in the absence of power (at least for a measurable duration).

One type of ferroelectric transistor is a metal-ferroelectric-metal-insulator-semiconductor (MFMIS) transistor. Such has a gate dielectric (insulator, I) between metal (M) and a semiconductor substrate (S). Such also has ferroelectric (F) material over the metal, and has a gate (typically comprising metal, M) over the ferroelectric material. In operation, an electric field across the ferroelectric material is used to switch the ferroelectric material from one polarization mode to another. The ferroelectric transistor comprises a pair of source/drain regions, and a channel region between the source/drain regions. Conductivity across the channel region is influenced by the polarization mode of the ferroelectric material. Another type of ferroelectric transistor is metal-ferroelectric-insulator-semiconductor (MFIS); in which ferroelectric material directly touches the insulator (i.e., in which there is no intervening metal between the ferroelectric material and the insulator).

The channel region may be considered to be contained within a body region of the ferroelectric transistor. During programming operations, carriers (holes and electrons) migrate into and out of the body region.

It can be difficult to incorporate ferroelectric-transistor-based memory cells into memory arrays. For instance, the operation of a first memory cell may adversely impact the memory state of a second memory cell (e.g., the memory state of the second memory cell may be disturbed when voltage is applied along wiring common to both the first memory cell and the second memory cell).

It is desired to develop ferroelectric-transistor-based memory cells suitable for incorporation into memory arrays. It would be desirable for such ferroelectric-transistor-based memory cells to have configurations which are scalable to ever-increasing levels of integration.

DETAILED DESCRIPTION OF THE ILLUSTRATED EMBODIMENTS

Some embodiments include assemblies in which ferroelectric transistors are provided along semiconductor structures between a pair of wirings (e.g., comparative digit lines). Field effect transistors are also provided along the semiconductor structures, and are utilized to selectively impede carrier flow between the wirings and the ferroelectric transistors. In some embodiments, the ferroelectric transistors and associated field effect transistors may be incorporated into memory cells, and the field effect transistors may be utilized to prevent an associated ferroelectric transistor of a first memory cell from being undesirably disturbed as a second memory cell is operated with a voltage applied to wiring shared by the first and second memory cells. Example embodiments are described with reference to FIGS. 1-13.

Figure 1:
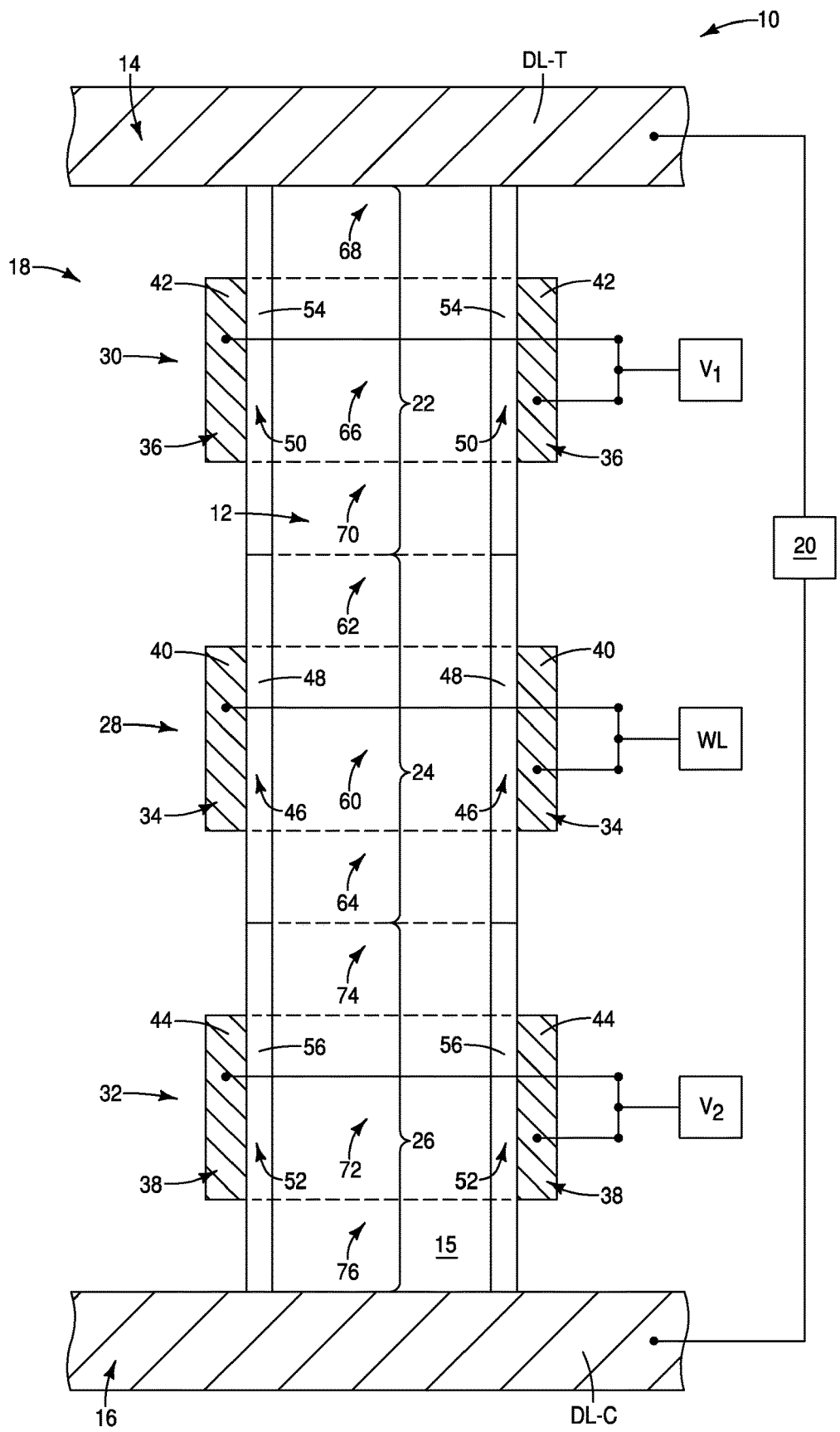
FIGS. 1, 2, 4 and 6-13 are diagrammatic cross-sectional side views of regions of example integrated assemblies.

Referring first to FIG. 1, such illustrates an assembly 10 which includes a semiconductor structure 12 extending from a first conductive structure 14 to a second conductive structure 16.

The semiconductor structure 12 comprises semiconductor material 15. The semiconductor material 15 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some example embodiments, the semiconductor material 15 may comprise, consist essentially of, or consist of silicon. The silicon may be in any suitable form, including, for example, monocrystalline, polycrystalline, amorphous, etc.

The semiconductor structure 12 is shown to be a vertically-extending pillar in the assembly 10 of FIG. 1. In other embodiments, the semiconductor structure 12 may have other configurations; with examples of such other configurations being described below with reference to FIGS. 10-13.

Referring still to FIG. 1, the conductive structures 14 and 16 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive structures 14 and 16 may comprise a same composition as one another in some embodiments, and in other embodiments may comprise different compositions relative to one another.

In some example embodiments, the conductive structures 14 and 16 correspond to wiring; such as, for example, conductive lines extending across a memory array. For instance, the semiconductor structure 12 may be comprised by a memory cell 18, and the conductive structures 14 and 16 may correspond to comparative digit lines (i.e., bitlines, sense lines, etc.) utilized for addressing such memory cell. The illustrated comparative digit lines are arranged in a paired set comprising a true digit line (DL-T) and a complementary digit line (DL-C). The terms "true" and "complementary" are arbitrary. The electrical values of the true and complementary digit lines are utilized together during reading/writing operations conducted relative to the memory cell 18. In some embodiments, the memory cell 18 may be considered to be a representative memory cell of a plurality of substantially identical memory cells within a memory array (with the term "substantially identical" meaning identical to within reasonable tolerances of fabrication and measurement).

The comparative bitlines 14 and 16 are electrically coupled with a device 20. Such device 20 may be a sense amplifier utilized to compare properties of the true digit line (DL-T) with those of the complementary digit line (DL-C) during a READ operation relative to the memory cell 18. Alternatively, or additionally, the device 20 may be utilized to impart desired electrical properties to the true and complementary digit lines (DL-T and DL-C) during a programming (i.e., WRITE) operation.

The semiconductor structure 12 is shown to be subdivided amongst regions 22, 24 and 26. Such regions may be referred to as first, second and third regions in order to distinguish them from one another. For instance, the region 24 may be referred to as the first region, while the regions 22 and 26 are referred to as the second and third regions. As another example, the region 22 may be referred to as the first region, while the regions 24 and 26 are referred to as the second and third regions.

In some embodiments, the regions 22, 24 and 26 may all have a same composition as one another. In other embodiments, one of the regions 22, 24 and 26 may comprise a different composition relative to another of the such regions.

The region 24 is incorporated into a ferroelectric field effect transistor (i.e., a FeFET) 28; and the regions 22 and 26 are incorporated into non-ferroelectric field effect transistors 30 and 32, respectively. For purposes of understanding this disclosure and the claims that follow, the terms "non-ferroelectric transistor" and "non-ferroelectric FET" are utilized to refer to transistors which operate without the polarization modes of a ferroelectric transistor. In contrast, the terms "ferroelectric transistor", "FeFET" and "ferroelectric FET" are utilized to refer to transistors having the polarization modes obtained through utilization of ferroelectric materials within the transistors.

In the shown embodiment, the non-ferroelectric transistor 30 is between the ferroelectric transistor 28 and the first wiring structure 14, and the non-ferroelectric transistor 32 is between the ferroelectric transistor 28 and the second wiring structure 16.

The ferroelectric transistor 28 includes a transistor gate 34 adjacent the region 24 of the semiconductor structure 12; and the non-ferroelectric transistors 30 and 32 comprise transistor gates 36 and 38, respectively, which are adjacent the regions 22 and 26 of the semiconductor structure 12. The transistor gates 34, 36 and 38 comprise conductive materials 40, 42 and 44, respectively. Such conductive materials may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive materials 40, 42 and 44 may all be the same composition as one another. In other embodiments, one of the conductive materials 40, 42 and 44 may comprise a different composition relative to another of the conductive materials 40, 42 and 44.

In some embodiments, the conductive gates 34, 36 and 38 may be referred to as first, second and third conductive gates to distinguish them from one another. For instance, the conductive gate 34 may be referred to as the first conductive gate, while the conductive gates 36 and 38 are referred to as the second and third conductive gates. As another example, the conductive gate 36 may be referred to as the first conductive gate, while the conductive gates 34 and 38 are referred to as the second and third conductive gates.

The transistor gate 34 of the ferroelectric transistor 28 is spaced from the region 24 of the semiconductor structure 12 by intervening regions 46 which comprise ferroelectric material 48. The ferroelectric material may be within an MFMIS configuration or an MFIS configuration; with example configurations being described in more detail below with reference to FIGS. 6-8.

The transistor gates 36 and 38 of the non-ferroelectric transistors 30 and 32 are spaced from the regions 22 and 26 of the semiconductor structure 12 by intervening regions 50 and 52, which comprise insulative materials 54 and 56, respectively. The insulative materials 54 and 56 may be referred to as first and second insulative materials to distinguish them from one another. The insulative materials 54 and 56 may comprise any suitable composition(s); and in some embodiments may comprise one or more of silicon dioxide, silicon nitride, aluminum oxide, hafnium oxide, etc. Further, the insulative materials 54 and 56 may comprise low concentrations of ferroelectric compositions, provided that the regions 50 and 52 operate as insulative regions of non-ferroelectric transistors rather than as ferroelectric regions of ferroelectric transistors (i.e., provided that the insulative regions 50 and 52 have such high switching voltage that for all practical purposes the regions 50 and 52 are traditional insulative regions of non-ferroelectric transistors rather than being ferroelectric regions of ferroelectric transistors).

The insulative materials 54 and 56 may comprise the same composition as one another, or may comprise different compositions relative to one another.

In the shown embodiment, the insulative material 54 of the non-ferroelectric transistor 30 is directly over the ferroelectric material 48 of the dielectric transistor 28, and abuts directly against an upper portion (i.e., upper surface) of such ferroelectric material. Similarly, the insulative material 56 is directly under the ferroelectric material 48 and abuts directly against a lower portion (i.e., lower surface) of the ferroelectric material.

The ferroelectric transistor 28 comprises a channel region (i.e., channel section) 60, and a pair of source/drain regions (i.e., source/drain sections) 62 and 64; with the channel region 60 being between the source/drain regions 62 and 64.

The gate 34 of the ferroelectric transistor 28 may be utilized to gatedly couple the source/drain regions 62 and 64 to one another through the channel region 60.

The non-ferroelectric transistor 30 comprises a channel region (i.e., channel section) 66, and a pair of source/drain regions (i.e., source/drain sections) 68 and 70; with the channel region 66 being between the source/drain regions 68 and 70. The gate 36 of the non-ferroelectric transistor 30 may be utilized to gatedly couple the source/drain regions 68 and 70 to one another through the channel region 66.

The non-ferroelectric transistor 32 comprises a channel region (i.e., channel section) 72, and a pair of source/drain regions (i.e., source/drain sections) 74 and 76; with the channel region 72 being between the source/drain regions 74 and 76. The gate 38 of the non-ferroelectric transistor 32 may be utilized to couple the source/drain regions 74 and 76 to one another through the channel region 72.

In some embodiments, the channel regions 60, 66 and 72 may be referred to as first, second and third regions (or sections) of the semiconductor structure 12. In such embodiments, the source/drain regions 62 and 64 may be referred to as first and second source/drain regions (or sections), the source/drain regions 68 and 70 may referred to as third and fourth source/drain regions (or sections), and the source/drain regions 74 and 76 may referred to as a fifth and sixth source/drain regions (or sections). In the shown embodiment, the first source/drain region 62 is coupled with the fourth source/drain region 70, the second source/drain region 64 is coupled with the fifth source/drain region 74, the third source/drain region 68 is coupled with the first wiring 14, and the sixth source/drain region 76 is coupled with the second wiring 16.

The gate 34 of the ferroelectric transistor 28 is coupled with a wordline WL; and the gates 36 and 38 of the non-ferroelectric transistors 30 and 32 are coupled with first and second voltage sources V1 and V2. The voltage sources V1 and V2 may be operated independently of one another, or may be coupled together (as discussed below with reference to, for example, FIGS. 2 and 3). The wordline WL may be operated independently of the voltage sources V1 and V2, or may be coupled together with such voltage sources (as discussed below with reference to, for example, FIGS. 4 and 5).

In some embodiments, the source/drain regions 62, 64, 68, 70, 74 and 76 may be n-type doped regions. For instance, such regions may be doped to a concentration of at least about $10^{21}$ atoms/cm$^3$ with n-type conductivity-enhancing dopant (e.g., phosphorus and/or arsenic). In such embodiments, the memory cell 18 may be programmed into a first memory state (a so-called "1" state) by operating the wordline WL and the comparative digit lines 14 and 16 to form electrons within the channel region 60. During such programming, the non-ferroelectric transistors 30 and 32 are maintained in an ON state by providing suitable voltage from the voltage sources V1 and V2. The memory cell 18 may be programmed into a second memory state (a so-called "0" state) by operating the wordline WL and the comparative digit lines 14 and 16 to form holes within the channel region 60. The programming operations may be referred to as WRITE operations.

The memory cell 18 may be read by providing appropriate voltages along the wordline and the comparative digit lines 14 and 16. During the READ operation, the non-ferroelectric transistors 30 and 32 are maintained in the ON state.

In between the READ and WRITE operations, the memory cell 18 is in a RESTING state (i.e., is not being addressed for a READ or WRITE operation). The non-ferroelectric transistors 30 and 32 may be utilized to impede carrier flow between the ferroelectric transistor 28 and the comparative digit lines 14 and 16 when the memory cell 18 is in the RESTING state by maintaining the ferroelectric transistors 30 and 32 in an OFF state. Such may be particularly advantageous if one or both of the comparative digit lines 14 and 16 is being utilized to address another memory cell while memory cell 18 is in the RESTING state.

It is noted that the electrons provided to the channel region 60 during the above-discussed programming operations may originate from the n-type doped source/drain regions 62 and 64. It is also noted that the holes provided to the channel region 60 during the above-discussed programming operations may be transferred to the channel region 60 through appropriate body contacts (not shown) and/or through gate induced drain leakage (GIDL). Also, although the above-discussed programming operations were discussed relative to a configuration having n-type source/drain regions, it is to be understood that analogous programming operations may be conducted relative to a configuration having p-type source/drain regions.

Figure 2:
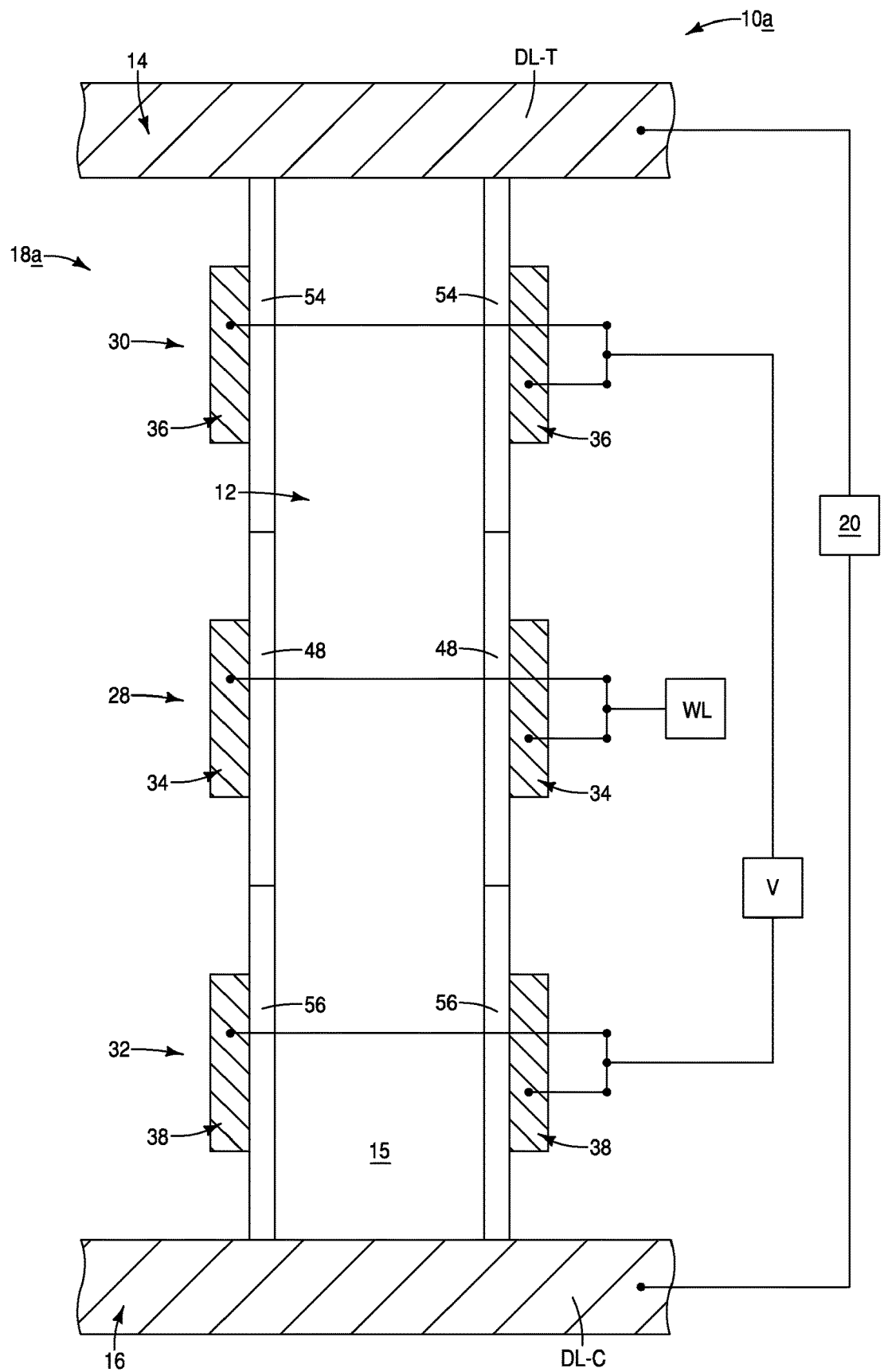

FIG. 2 shows an integrated assembly 10a analogous to the assembly 10 described above with reference to FIG. 1, and comprising a memory cell 18a analogous to the memory cell 18 described above with reference to FIG. 1. The memory cell 18a includes the semiconductor structure 12 configured as a semiconductor pillar extending vertically between the first comparative digit line 14 and the second comparative digit line 16. The non-ferroelectric transistor 30, ferroelectric transistor 28 and non-ferroelectric transistor 32 are along the semiconductor pillar 12. The non-ferroelectric transistor 30 gates an upper region of the semiconductor pillar 12, the ferroelectric transistor 28 gates a middle region of the semiconductor pillar, and the non-ferroelectric transistor 32 gates a lower region of the semiconductor pillar. The channel regions and source/drain regions are not shown in FIG. 2 in order to simplify the drawing, but such may be analogous to the channel regions and source/drain regions shown in FIG. 1.

The transistors 30, 28 and 32 comprise the gates 36, 34 and 38, respectively; and such gates are vertically-spaced from one another.

In the shown embodiment, the upper non-ferroelectric transistor 30 and the lower non-ferroelectric transistor 38 are both spaced from the ferroelectric transistor 28 by about a same distance as one another. In other embodiments, such spacing may vary. Also, although two non-ferroelectric transistors are shown, in other embodiments there may be additional non-ferroelectric transistors incorporated into the memory cell 18a. Also, it is to be understood that the memory cell 18a is one example embodiment for utilizing a non-ferroelectric transistor between a conductive structure and a ferroelectric transistor. Other embodiments (besides those specifically illustrated herein) may utilize other conductive structures besides comparative bitlines. Such other embodiments may have only one conductive structure (e.g., wiring) coupled with the ferroelectric transistor through a semiconductor structure; and in such other embodiments there may be only a single non-ferroelectric transistor utilized together with the ferroelectric transistor.

The ferroelectric transistor 34 is referred to as gating a "middle" region of the semiconductor pillar 12. In the context of such discussion, the term "middle" simply means that the ferroelectric transistor is gating a region between the upper region gated by the non-ferroelectric transistor 30 and the lower region gated by the non-ferroelectric transistor 32. The "middle" region may or may not be a region which is about halfway between the upper and lower regions; and may or may not be a region which is about halfway along the vertical semiconductor pillar 12.

In the embodiment of FIG. 2, the gates 36 and 38 of the non-ferroelectric transistors 30 and 32 are coupled with a common voltage source V, and the transistor gate 34 of the ferroelectric transistor 28 is coupled with a wordline WL. The wordline WL may be considered to correspond to another voltage source different from the common voltage source.

Figure 3:
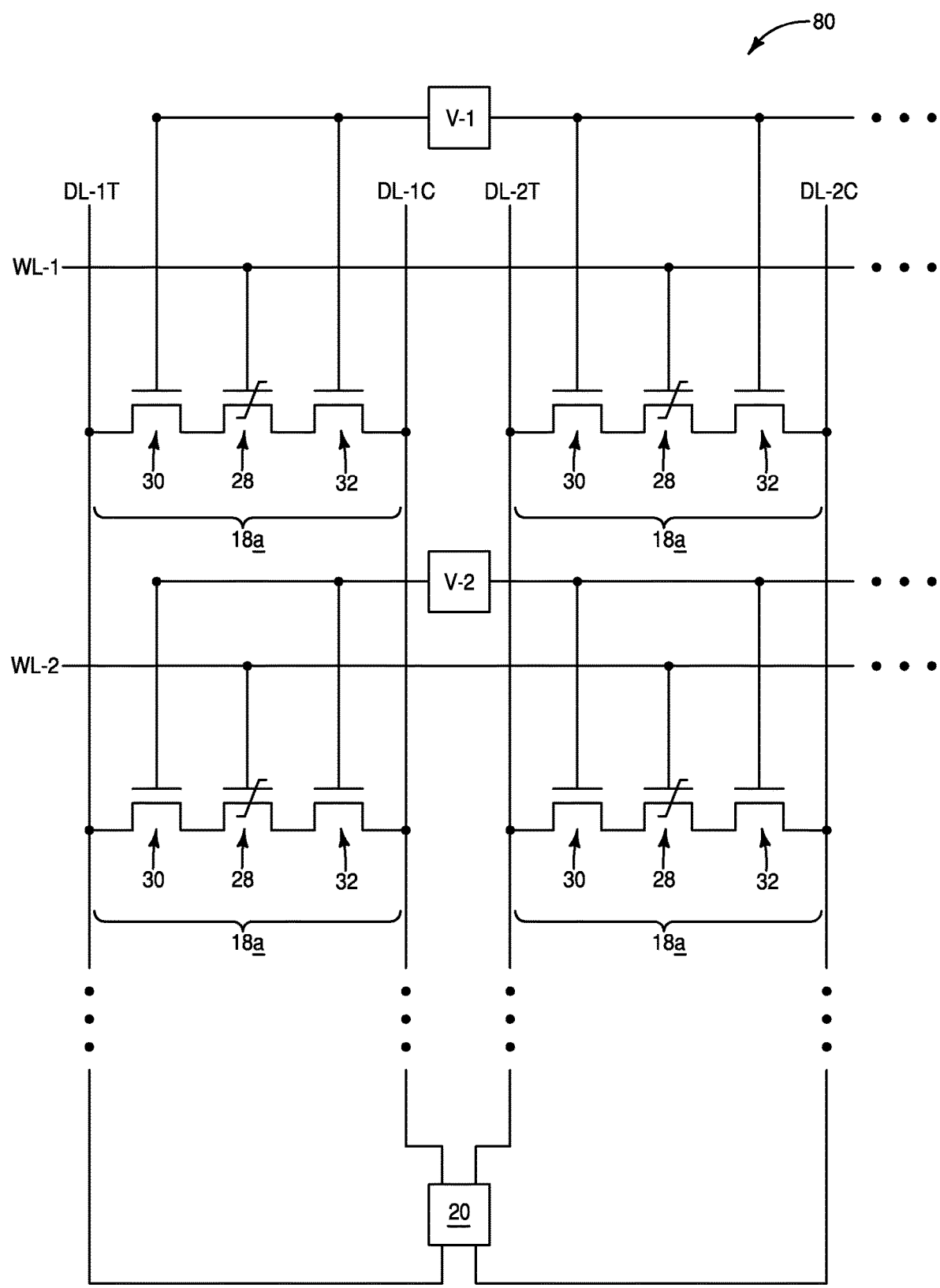
FIGS. 3 and 5 are diagrammatic schematic views of regions of example memory arrays.

The memory cell 18a may be considered to be a representative memory cell of a plurality of substantially identical memory cells within a memory array. FIG. 3 schematically illustrates a region of a memory array 80 comprising a plurality of substantially identical memory cells 18a. Each memory cell comprises a ferroelectric transistor 28, and a pair of non-ferroelectric transistors 30 and 32. The illustrated region of the memory array comprises a first pair of comparative digit lines (DL-1T, DL-1C), a second pair of comparative digit lines (DL-2T, DL-2C), and a pair of wordlines (WL-1, WL-2). The wordlines may be considered to extend along rows of the memory array, and the comparative digit lines may be considered to extend along columns of the memory array. The non-ferroelectric transistors along a first row of the memory array (i.e., the row comprising the wordline WL-1) are coupled with a first voltage source V-1, and the non-ferroelectric transistors along a second row of the memory array (i.e., the row comprising the wordline WL-2) are coupled with a second voltage source V-2. Such enables the non-ferroelectric transistors along the first row to be controlled independently of the ferroelectric transistors along the second row.

The coupling of the non-ferroelectric transistors 30 and 32 to a separate voltage source than the wordline (as shown in FIGS. 2 and 3) may be advantageous in some embodiments. Specifically, charge may accumulate within the channel region of one or both of the first and second non-ferroelectric transistors 30 and 32 over time, and the voltage source coupled with the non-ferroelectric transistors 30 and 32 may be utilized to discharge such charge accumulation without disturbing a memory state retained on the ferroelectric transistor 28.

Figure 4:
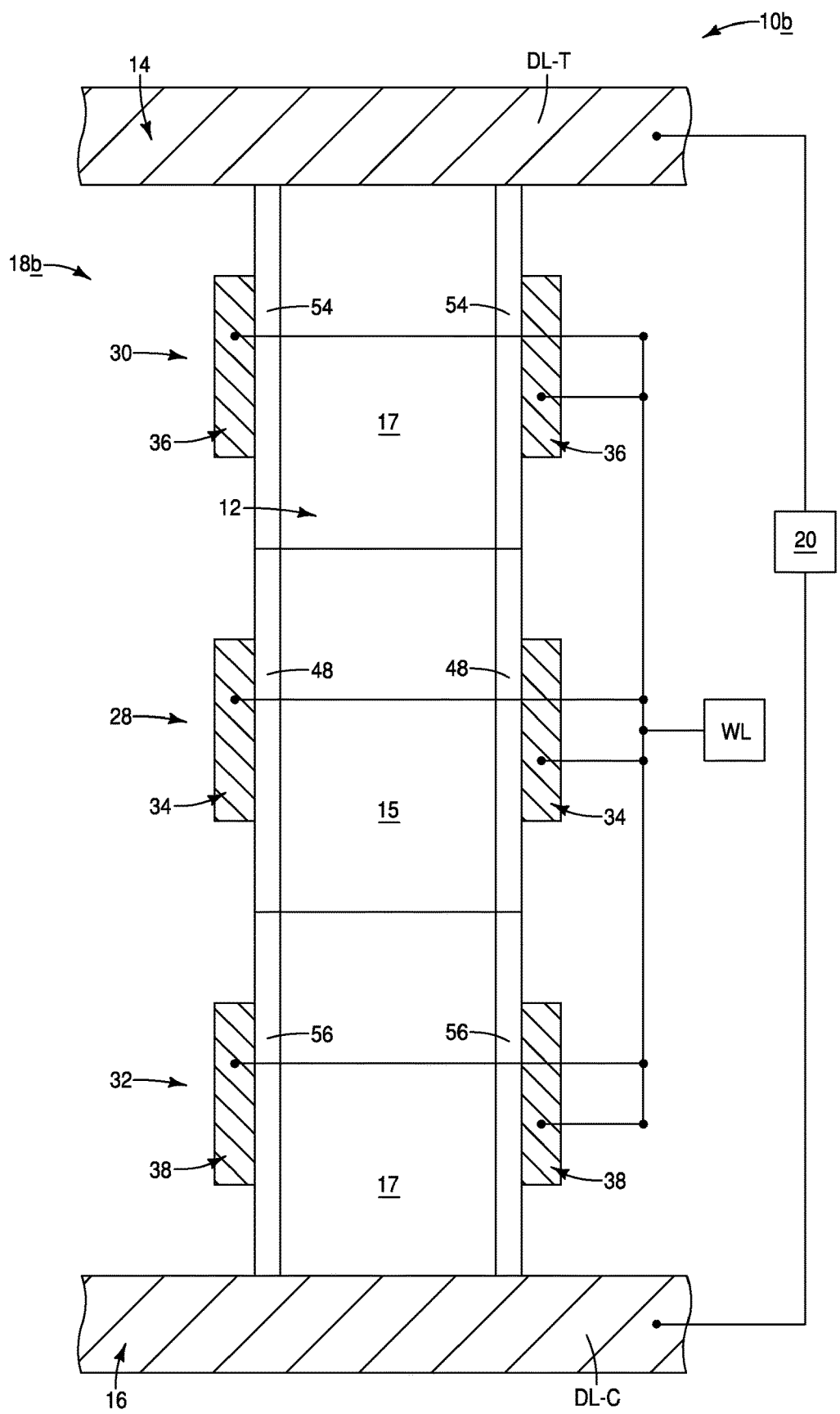

FIG. 4 shows an integrated assembly 10b analogous to the assembly 10a described above with reference to FIG. 2, and comprising a memory cell 18b analogous to the memory cell 18a described above with reference to FIG. 2. The memory cell 18b includes the semiconductor structure 12 configured as the semiconductor pillar extending vertically between the first comparative digit line 14 and the second comparative digit line 16. The non-ferroelectric transistor 30, ferroelectric transistor 28 and non-ferroelectric transistor 32 are along the semiconductor pillar 12.

The memory cell 18b of FIG. 4 differs from the memory cell 18a of FIG. 2 in that the gates 36 and 38 of the non-ferroelectric transistors 30 and 32 are coupled with the wordline WL. The wordline WL may be considered to correspond to a common voltage source coupled with all of the transistor gates 34, 36 and 38.

FIG. 4 also shows the semiconductor pillar 12 comprising two different compositions 15 and 17; with the composition 17 being associated with the non-ferroelectric transistors 30 and 32, and the composition 15 being associated with the ferroelectric transistor 28. The utilization of two different semiconductor compositions 15 and 17 may enable the performance of the ferroelectric transistor 28 to be tailored relative to performances of the non-ferroelectric transistors 30 and 32. The semiconductor compositions 15 and 17 may comprise any suitable compositions, including any of silicon, germanium, III/V semiconductor material, semiconductor oxide, etc. For instance, in some embodiments both of the materials 15 and 17 may comprise silicon, and one of the materials 15 and 17 may also include germanium.

Although FIG. 4 is shown comprising a different composition of the semiconductor material within the ferroelectric transistor 28 as compared to the non-ferroelectric transistors 30 and 32, it is to be understood that the invention also includes embodiments analogous to FIG. 4 in which the semiconductor pillar 12 comprises a single uniform semiconductor composition extending across all the ferroelectric transistor and the non-ferroelectric transistors (i.e., embodiments having the semiconductor pillar of FIG. 4 being identical to the pillar shown relative to the assembly 10a of FIG. 2). Also, it is to be understood that any of the embodiments described herein may have a different composition of semiconductor material associated with a ferroelectric transistor relative to an adjacent non-ferroelectric transistor; and such is not limited simply to the embodiment of FIG. 4.

Figure 5:
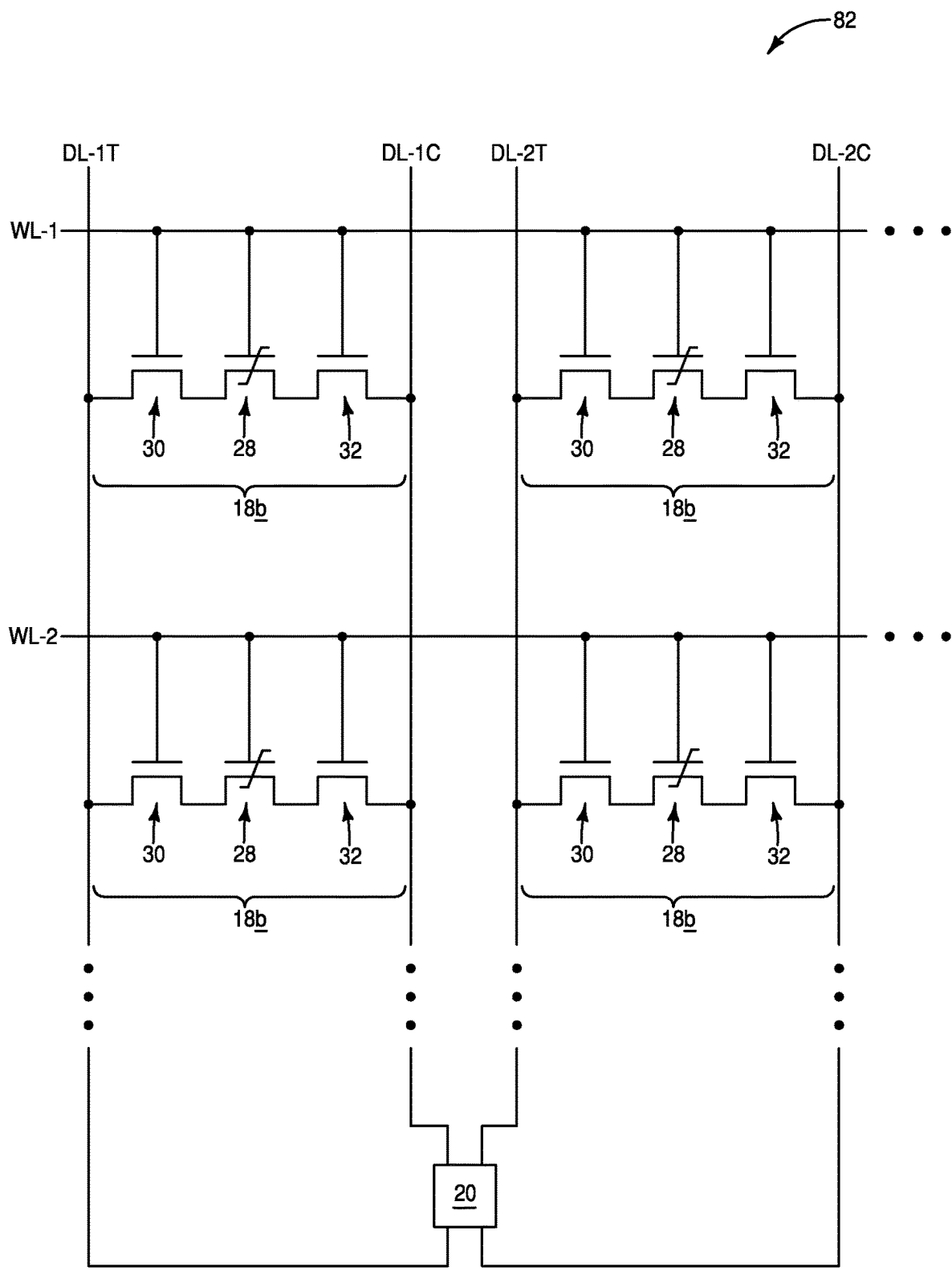

The memory cell 18b of FIG. 4 may be considered to be a representative memory cell of a plurality of substantially identical memory cells within a memory array. FIG. 5 schematically illustrates a region of a memory array 82 comprising a plurality of substantially identical memory cells 18b. Each memory cell comprises a ferroelectric transistor 28, and a pair of non-ferroelectric transistors 30 and 32. The illustrated region of the memory array comprises the first pair of comparative digit lines (DL-1T, DL-1C), the second pair of comparative digit lines (DL-2T, DL-2C), and the pair of wordlines (WL-1, WL-2). The non-ferroelectric transistors along each row of the memory array (e.g., the row comprising the wordline WL-1) are coupled with the wordline of such row. Such enables the non-ferroelectric transistors along each row to be controlled with the wordline. Specifically, when the wordline is ON, the ferroelectric transistors 28 along the wordline are activated and simultaneously the non-ferroelectric transistors 30 and 32 are also activated. The activated ferroelectric transistor 28 enables READING/WRITING operations to be performed relative to a memory cell 18b; and the activated non-ferroelectric transistors 30 and 32 enable carriers to pass between the comparative digit lines (e.g. DL-1T, DL-1C) and the activated ferroelectric transistor 28. When the wordline is OFF, the ferroelectric transistors 28 along the wordline are not activated and the memory cells 18b along the wordline are in a RESTING state. Also, the non-ferroelectric transistors 30 and 32 along the wordline are not activated (i.e., are OFF), and preclude charge carriers from passing between the comparative digit lines and the ferroelectric transistors of the RESTING memory cells. In some embodiments, the non-ferroelectric transistors 30 and 32 may be considered to function as "chokes" which are CLOSED and restrict charge-carrier migration when a memory cell 18b is in a RESTING state, and which are OPEN and substantially non-restrictive of charge-carrier migration when the memory cell is in a READ/WRITE state.

Figure 6:
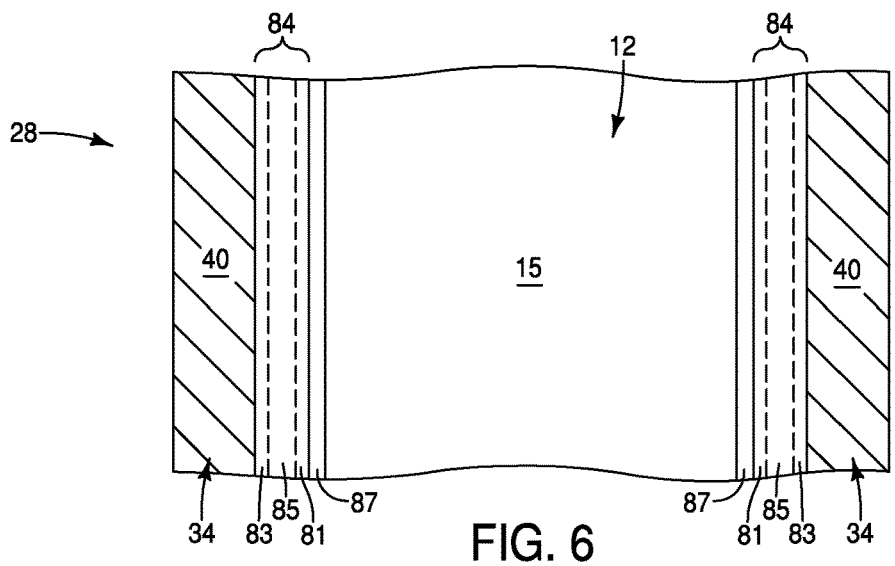
Figure 7:
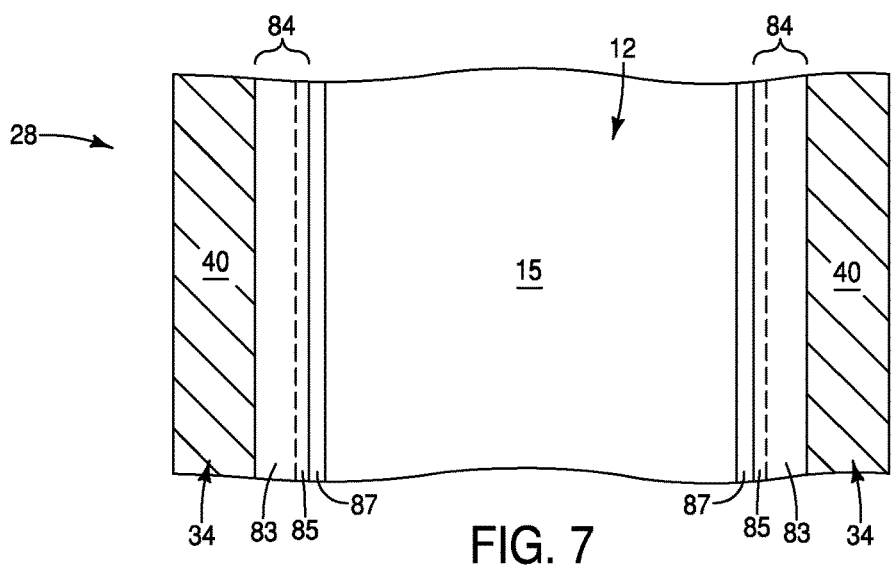
Figure 8:
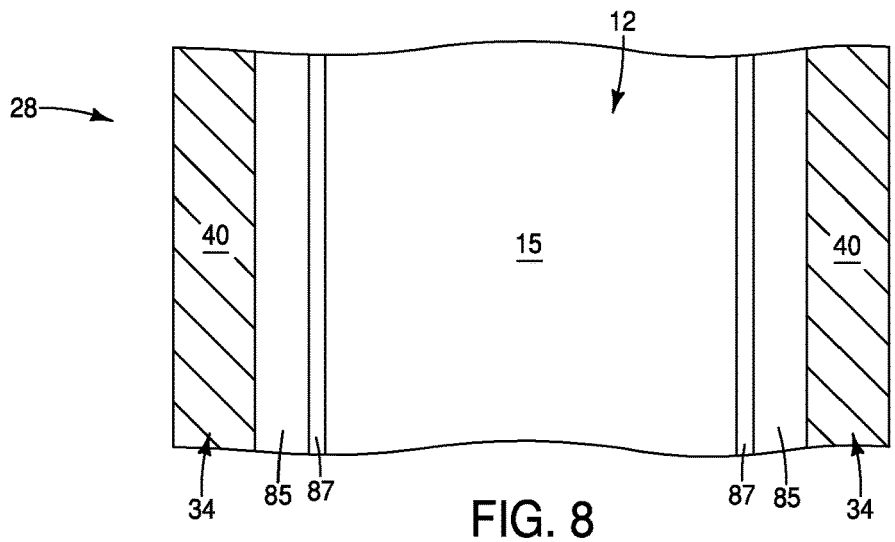

The ferroelectric transistors 28 described herein may have any suitable configurations. FIGS. 6-8 illustrate a few example configurations.

FIG. 6 shows a configuration in which the ferroelectric material is within a stack 84 comprising the ferroelectric material 85 between a pair of metal-containing materials 81 and 83 (so-called MFM stacks). Dashed lines are utilized to diagrammatically illustrate approximate boundaries between the various materials within the stack 84. The metal-containing materials 81 and 83 may comprise any suitable metals or metal-containing compositions; including, for example, one or more of tungsten, titanium, titanium nitride, etc. The ferroelectric material 85 may comprise any suitable composition or combination of compositions; and may, for example, comprise, consist essentially of, or consist of one or more materials selected from the group consisting of transition metal oxide, zirconium, zirconium oxide, hafnium, hafnium oxide, lead zirconium titanate, tantalum oxide, and barium strontium titanate; and having dopant therein which comprises one or more of silicon, aluminum, lanthanum, yttrium, erbium, calcium, magnesium, strontium, and a rare earth element. The ferroelectric material may be provided in any suitable configuration; such as, for example, a single homogeneous material, or a laminate of two or more discrete separate materials.

An insulative material 87 is between the MFM stacks 84 and the semiconductor material 15 of the semiconductor pillar 12. The insulative 87 may comprise any suitable composition(s); and in some embodiments may comprise, consist essentially of, or consist of silicon dioxide. The configuration of FIG. 6 may be considered to be an example of an MFMIS configuration.

FIG. 7 shows a configuration similar to that of FIG. 6, except that the stack 84 only comprises the metal-containing material 83 and the ferroelectric material 85. The configuration of FIG. 7 may be considered to be an example of an MFIS configuration.

FIG. 8 shows a configuration in which the ferroelectric material 85 is the only material between the insulative material 87 and the conductive gate material 40 of the ferroelectric transistor 28. The conductive gate material 40 may comprise metal adjacent the ferroelectric material 85, and accordingly FIG. 8 may be considered to be another example of an MFIS configuration. It is noted that FIGS. 7 and 8 are basically the same configuration as one another, with the only difference being whether the metal of the MFIS configuration is defined as being part of the gate material 40, or is instead defined as being part of a separate stack 84. Analogously, the MFMIS configuration of FIG. 6 may include material of the gate 40 as the first metal of the MFMIS structure, rather than having such metal being considered to be part of the stack 84.

Figure 9:
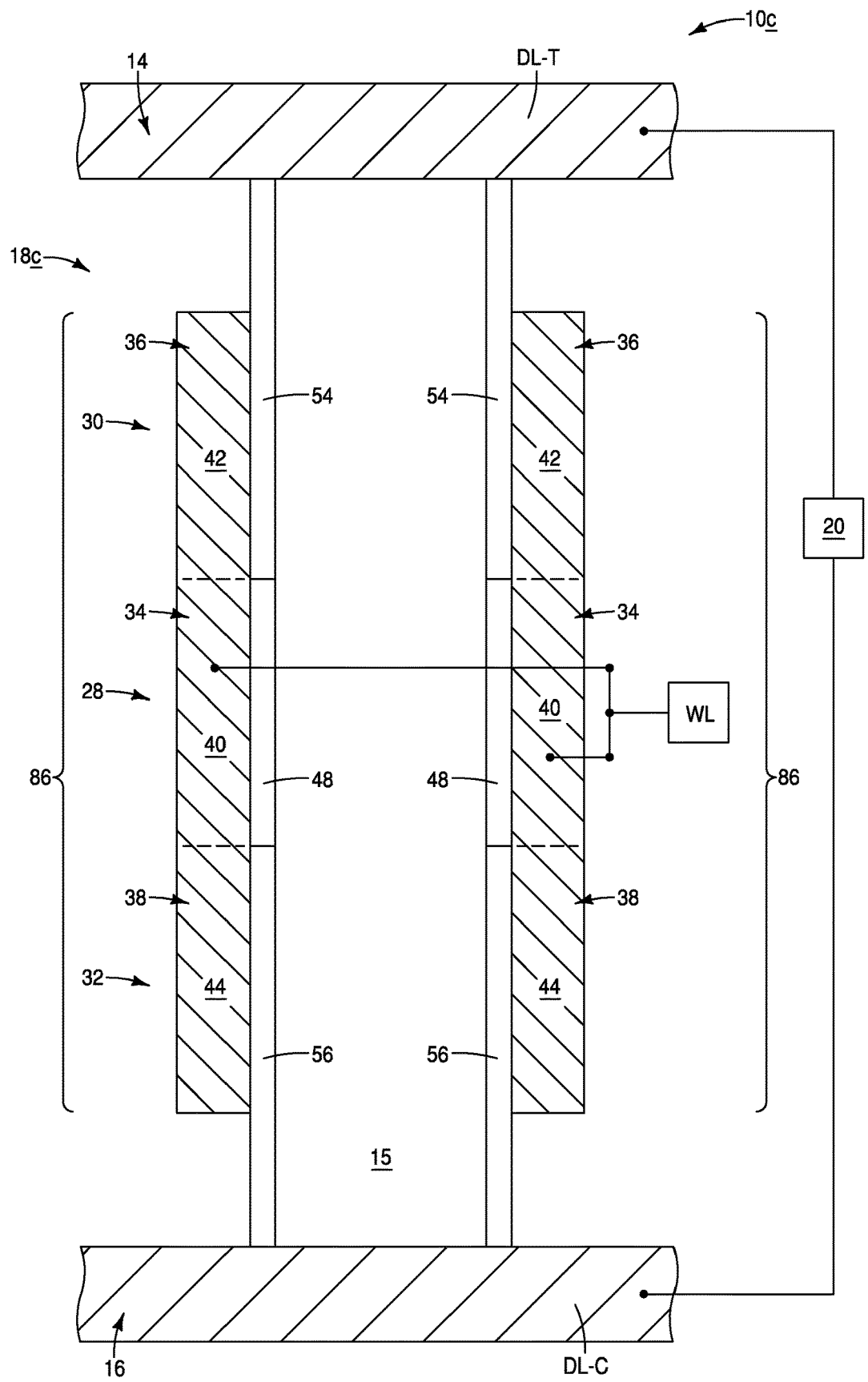

Referring to FIG. 9, such shows an assembly 10c illustrating another memory cell configuration (specifically, a configuration of a memory cell 18c). The assembly 10c of FIG. 9 is similar to the assembly 10b of FIG. 4, except that the transistors 28, 30 and 32 are not vertically spaced from one another. Instead, a single conductive structure 86 comprises the transistor gates 34, 36 and 38 of the ferroelectric transistor 28 and the non-ferroelectric transistors 30 and 32. In other words, the single conductive structure 86 comprises the conductive materials 40, 42 and 44 of the transistor gates 28, 30 and 32.

In some embodiments, the gate material 40 of the ferroelectric transistor 28 may comprise a same composition as the gate materials 42 and 44 of the non-ferroelectric transistors 30 and 32. Accordingly, the conductive structure 86 may comprise a single uniform composition throughout. In other embodiments, at least a portion of the conductive material 40 of the ferroelectric transistor 28 may differ in composition relative to a region of the conductive material 42 or 44 directly against such portion. In some embodiments, the entirety of the conductive material 40 of the ferroelectric transistor 28 may differ in composition from the compositions of the materials 42 and 44 of the non-ferroelectric transistors 30 and 32. The compositions the conductive gate materials 40, 42 and 44 may be tailored to optimize performance of the ferroelectric transistor 28 and the non-ferroelectric transistors 30 and 32. Alternatively, the conductive gate materials 40, 42 and 44 may all have the same composition as one another in order to simplify fabrication of the conductive structure 86.

The memory cell 18c of FIG. 9 may be utilized in a memory array analogous to the array 82 described above with reference to FIG. 5.

Figure 10:
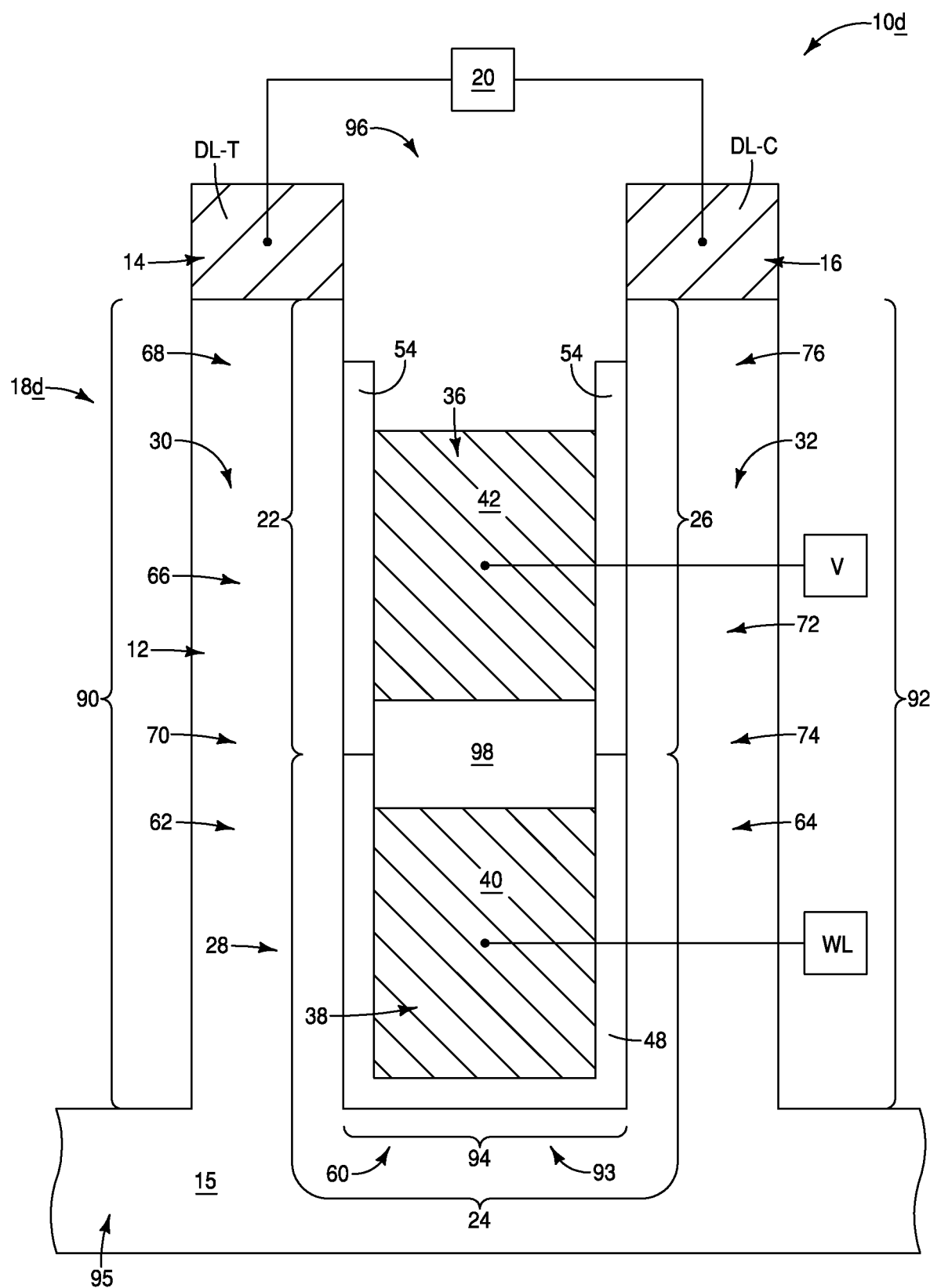

Referring to FIG. 10, such shows an assembly 10d illustrating another memory cell configuration (specifically, a configuration of a memory cell 18d). The conductive structures 14 and 16 (the comparative bitlines DL-T and DL-C in the shown embodiment) are laterally offset from one another. In the illustrated embodiment, the conductive structures 14 and 16 are at about a same horizontal level as one another, but in other embodiments the conductive structures 14 and 16 may be vertically offset from one another as well as being laterally offset from one another.

The semiconductor structure 12 extends from the first conductive structure 14 to the second conductive structure 16. The semiconductor structure 12 is shaped as an upwardly-opening container; and specifically has a first stem 90 extending downwardly from the first conductive structure 14, a second stem 92 extending downwardly from the second conductive structure 16, and a segment 94 extending from the first stem 90 to the second stem 92. A trough 96 may be defined as being between the first and second stems 90 and 92, and over the segment 94 (i.e., may be defined as being within the upwardly-opening container shape of the semiconductor structure 12).

The first non-ferroelectric transistor 30 is under the first conductive structure 14 and gates an upper region of the first stem 90, and the second non-ferroelectric transistor 32 is under the second conductive structure 16 and gates an upper region of the second stem 92. The first and second non-ferroelectric transistors share a conductive gate 36 comprising the gate material 42. The gate material 42 is spaced from the semiconductor material 15 of the stems 90 and 92 by insulative regions comprising the insulative material 54.

The ferroelectric transistor 28 is under the first and second non-ferroelectric transistors 30 and 32, and gatedly couples lower regions of the first and second stems (90 and 92) to one another through a body region 93 that extends along the segment 94.

In some embodiments, the ferroelectric transistor 28 may be considered to correspond to a ferroelectric configuration which is under the non-ferroelectric transistors 30 and 32.

The ferroelectric transistor 28 comprises the transistor gate 38. In some embodiments, the gates 36 and 38 may be referred to as first and second transistor gates. The first transistor gate 36 is within an upper region of the trough 96, and the second transistor gate 38 is within a lower region of the trough 96.

The first and second transistor gates 36 and 38 are vertically spaced from one another; and in the shown embodiment an insulative material 98 is between the first and second gates 36 and 40. The insulative material 98 may comprise any suitable composition(s); and in some embodiments may comprise, consist essentially of, or consist of silicon dioxide.

The body region 93 comprises a portion of the ferroelectric-transistor channel region 60. The stems 90 and 92 comprise the ferroelectric-transistor source/drain regions 62 and 64; the non-ferroelectric-transistor channel regions 66 and 72; and the non-ferroelectric-transistor source/drain regions 68, 70, 74 and 76.

In some embodiments, the semiconductor structure 12 of FIG. 10 may be considered to comprise regions 22, 24 and 26 analogous to those discussed above with reference to FIG. 1. For instance, the region 24 may be considered to be a first region corresponding to a ferroelectric-transistor-region; and the regions 22 and 26 may be considered to be second and third regions corresponding to non-ferroelectric-transistor regions. In the shown embodiment, the first region 24 is shaped as an upwardly-opening container, with one side of the container being directly under the second region 22, and another side of the container being directly under the third region 26. The first region 24 is directly against both the second region 22 and the third region 26 in the illustrated embodiment of FIG. 10.

In some embodiments, the non-ferroelectric-transistor region 22 may be considered to be between the ferroelectric transistor region 24 and the first conductive structure 14, and the non-ferroelectric-transistor region 26 may be considered to be between the ferroelectric-transistor region 24 and the second conductive structure 16.

The segment 94 may be considered to comprise a body region of the ferroelectric transistor 28. The segment 94 is part of an expanse 95 of the semiconductor material 15, with such expanse extending beyond the memory cell 18d.

The memory cell 18d may be operated analogously to the memory cell 18a of FIG. 2. Specifically, the transistor gate 36 of the non-ferroelectric transistors 30 and 32 may be coupled with the voltage source V, and the transistor gate 38 of the ferroelectric transistor 28 may be coupled with the wordline WL. Accordingly, the memory cell 18d may be incorporated into a memory array 80 of the type described above with reference to FIG. 3. Alternatively, the transistor gates 36 and 38 may both be coupled with the wordline WL, and the memory cell may be incorporated into a memory array 82 of the type described above with reference to FIG. 5.

Figure 11:
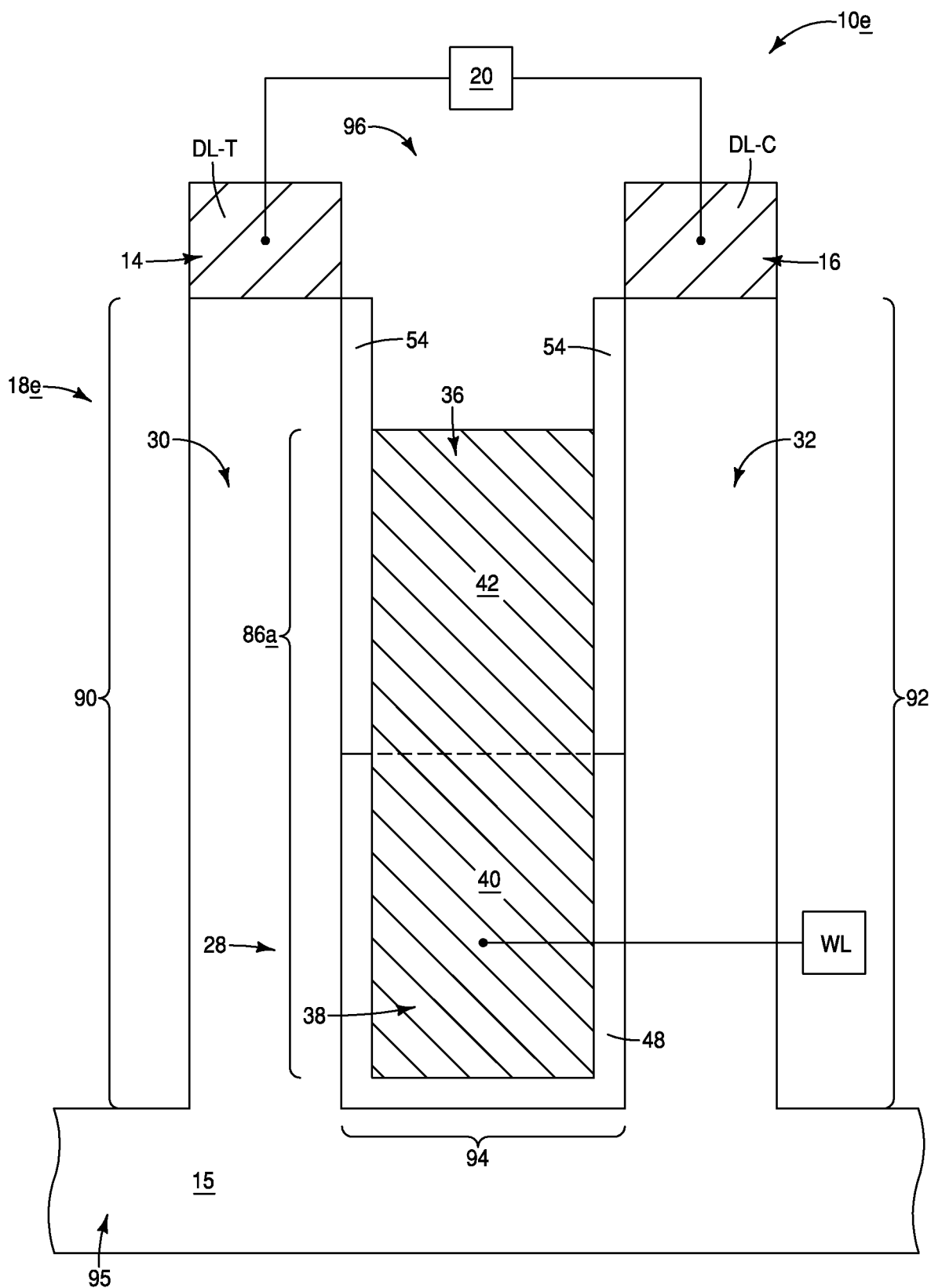

FIG. 11 shows an assembly 10e comprising a memory cell 18e analogous to the memory cell 18d of FIG. 10, but in which the non-ferroelectric transistor gate 36 is directly against the ferroelectric transistor gate 38. The gates 36 and 38 are together comprised by a single conductive structure 86a analogous the structure 86 described above with reference to FIG. 9. The structure 86a comprises the gate material 40 of the ferroelectric transistor 28, and the gate material 42 of the non-ferroelectric transistors 30 and 32. The structure 86a may comprise a single uniform composition throughout (e.g., the gate materials 40 and 42 may be identical in composition relative to one another), or may comprise multiple compositions (e.g., the gate materials 40 and 42 may be different from one another). In some embodiments, a portion of the second transistor gate 38 may be different in composition relative to a region of the first transistor gate 36 which is directly against the second transistor gate. Accordingly, the compositions of the non-ferroelectric transistor gate 36 and the ferroelectric transistor gate 38 may be optimized relative to another. In other embodiments, the materials 40 and 42 are identical to one another in order to simplify fabrication of the conductive structure 86a.

The memory cell 18e of FIG. 11 may be operated analogously to the memory cell 18b of FIG. 4. Accordingly, the memory cell 18e may be incorporated into a memory array 82 of the type described above with reference to FIG. 5.

Figure 12:
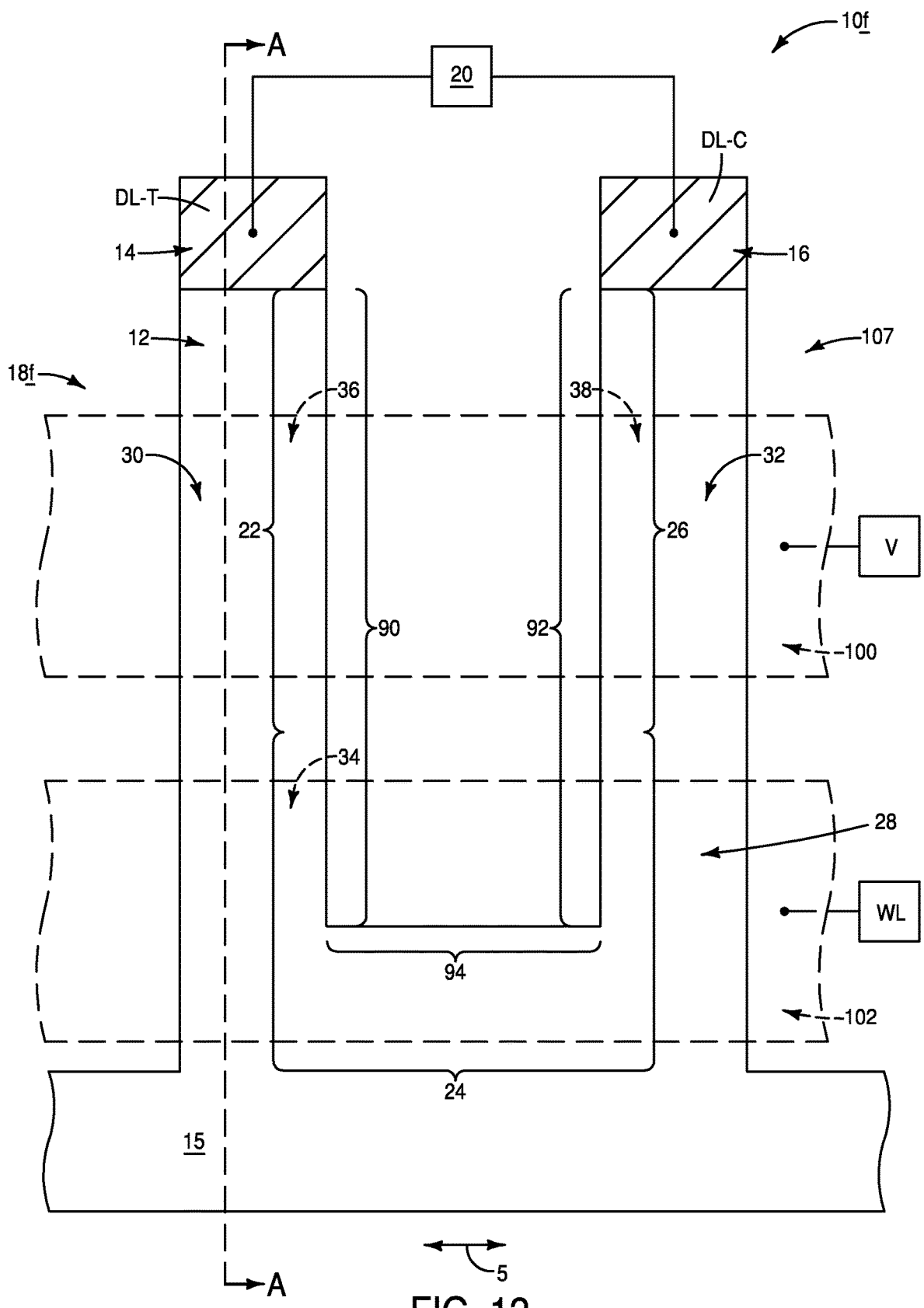
Figure 12A:
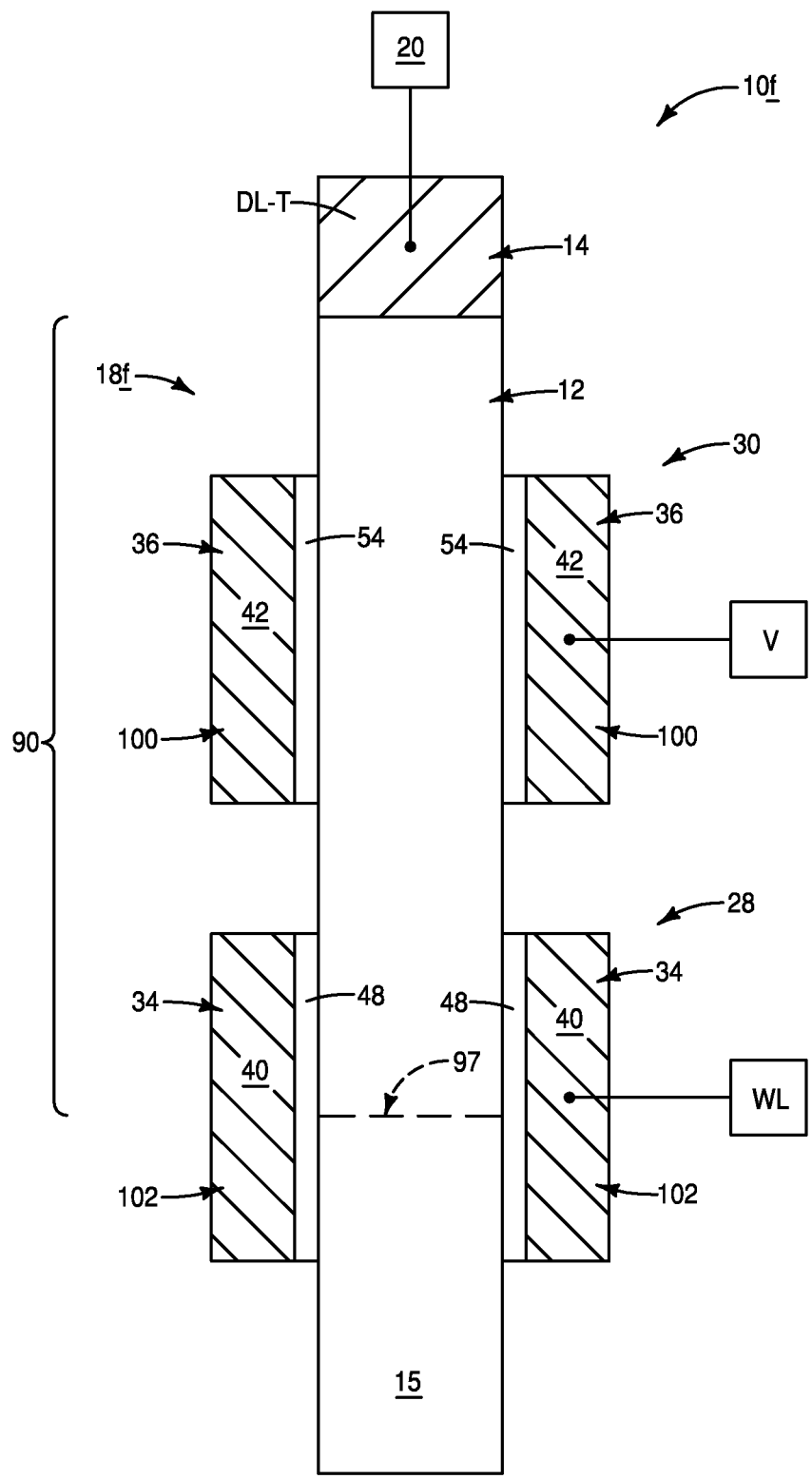
FIGS. 12A and 13A are diagrammatic cross-sectional side views along the lines A-A of FIGS. 12 and 13, respectively.

Referring to FIGS. 12 and 12A, such show an assembly 10f illustrating another memory cell configuration (specifically, a configuration of a memory cell 180. The conductive structures 14 and 16 (the comparative bitlines DL-T and DL-C in the shown embodiment) are laterally offset from one another. In the illustrated embodiment, the conductive structures 14 and 16 are at about a same horizontal level as one another, but in other embodiments the conductive structures 14 and 16 may be vertically offset from one another as well as being laterally offset from one another.

The semiconductor structure 12 is shaped as an upwardly-opening container analogous to that of FIG. 10; and has the first stem 90 extending downwardly from the first conductive structure 14, the second stem 92 extending downwardly from the second conductive structure 16, and the segment 94 extending from the first stem 90 to the second stem 92. Alternatively, the semiconductor structure 12 may be considered to be configured as an upwardly-opening container 107 comprising the segment 94 along a bottom of the container, the stem 90 corresponding to a first leg extending upwardly from a first side of the bottom segment 94, and the stem 92 corresponding to a second leg extending upwardly from a second side of the bottom segment 94.

The segment 94 extends along a first direction represented by an axis 5. A dashed line 97 in FIG. 12A represents an approximate location of an upper surface of the segment 94.

The non-ferroelectric transistor 30 is within an upper region of the stem (i.e. leg) 90, and the non-ferroelectric transistor 32 is within an upper region of the stem (i.e. leg) 92. A conductive line 100 passes across the stems (i.e. legs) 90 and 92. Such conductive line is out of the plane relative to the view of FIG. 12, and accordingly is shown in dashed-line (phantom) view relative to FIG. 12. The conductive line 100 comprises the conductive gate material 42 (shown in the cross-section of FIG. 12A), and comprises the gates 36 and 38 of the non-ferroelectric transistors 30 and 32. In some embodiments, the gates 36 and 38 may be referred to as first and second transistor gates, respectively. The gates 36 and 38 may be considered to be along the regions 22 and 26 of the semiconductor structure 12; and in the embodiment of FIGS. 12 and 12A such regions are laterally spaced from one another.

The ferroelectric transistor 28 is along lower regions of the stems (i.e. legs) 90 and 92, and extends across a region of the bottom segment 94. In some embodiments, the ferroelectric transistor 28 may be considered to represent a ferroelectric configuration that couples lower regions of the stems (i.e., legs) 90 and 92 to one another through a body region that extends along the segment 94.

The ferroelectric transistor 28 may be considered to be along the region 24 of the semiconductor structure 12. The region 24 may be referred to as a first region of the semiconductor structure, and the regions 22 and 26 may be referred to as second and third regions of the semiconductor structure. The region 24 is under the regions 22 and 26. The region 24 is spaced from the first conductive structure 14 by an intervening portion of semiconductor structure 12 which includes the region 22, and is spaced from the second conductive structure 16 by an intervening portion of semiconductor structure 12 which includes the region 26. In the illustrated embodiment of FIG. 12, the first region 24 is directly against the second region 22 and is also directly against the third region 26.

A conductive line 102 passes across the stems (i.e. legs) 90 and 92, with the conductive line 102 being under the conductive line 100. The conductive line 102 is also out of the plane relative to the view of FIG. 12, and accordingly is shown in dashed-line view relative to such figure. The conductive line 102 comprises the conductive gate material 40 (shown in FIG. 12A), and comprises the gate 34 of the ferroelectric transistor 28.

The conductive lines 100 and 102 extend along the first direction of axis 5; and may be referred to as first and second conductive lines, respectively. The conductive lines 100 and 102 are vertically spaced from one another in the embodiment of FIGS. 12 and 12A.

The memory cell 18f may be utilized analogously to the memory cell 18a of FIG. 2. Specifically, the transistor gates 36 and 38 of the non-ferroelectric transistors 30 and 32 may be coupled with the voltage source V, and the transistor gate 34 of the ferroelectric transistor 28 may be coupled with the wordline WL. Accordingly, the memory cell 18f may be incorporated into a memory array 80 of the type described above with reference to FIG. 3. Alternatively, the transistor gates 36 and 38 may be coupled with the wordline WL, and the memory cell may be incorporated into a memory array 82 of the type described above with reference to FIG. 5.

Figure 13:
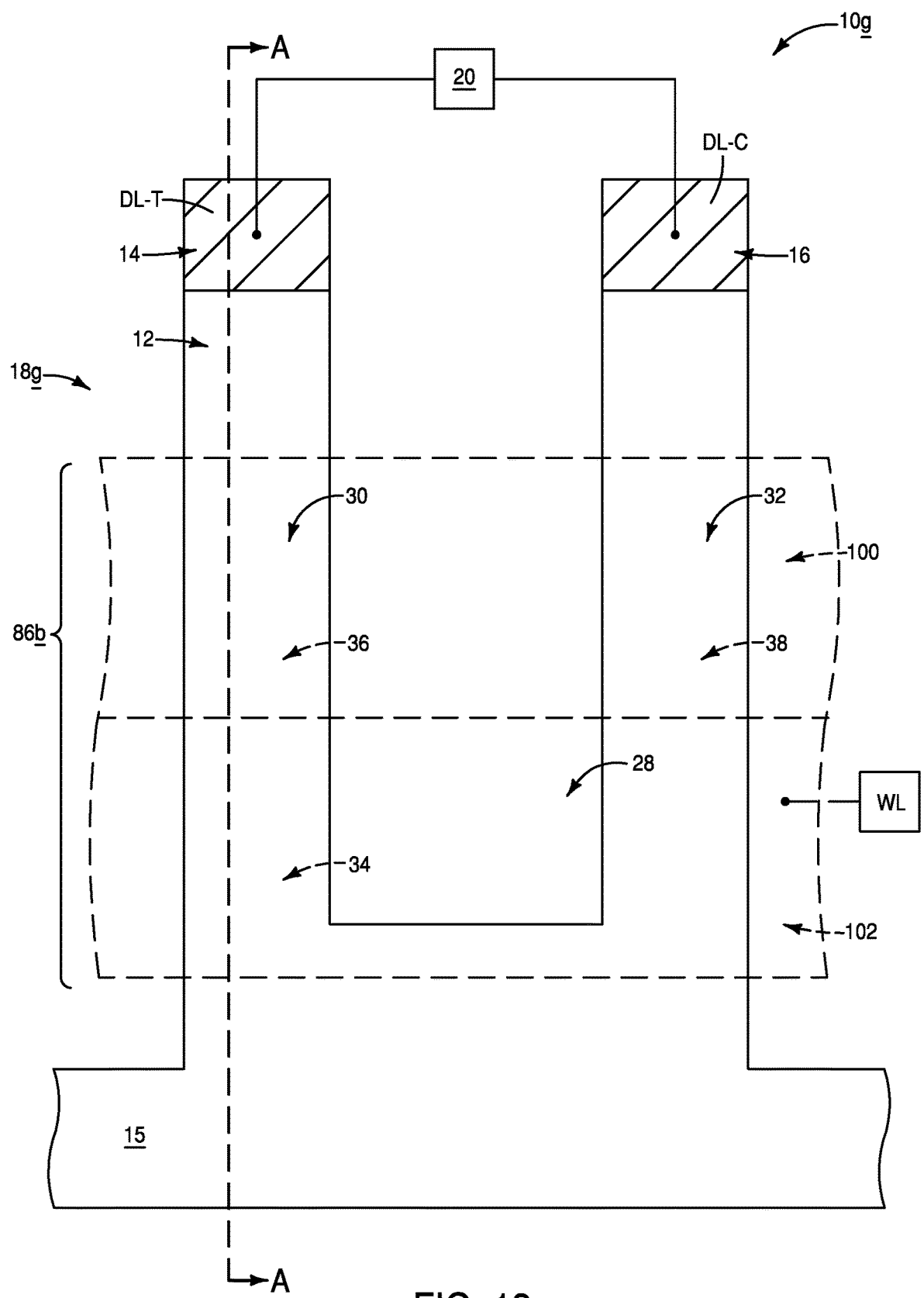
Figure 13A:
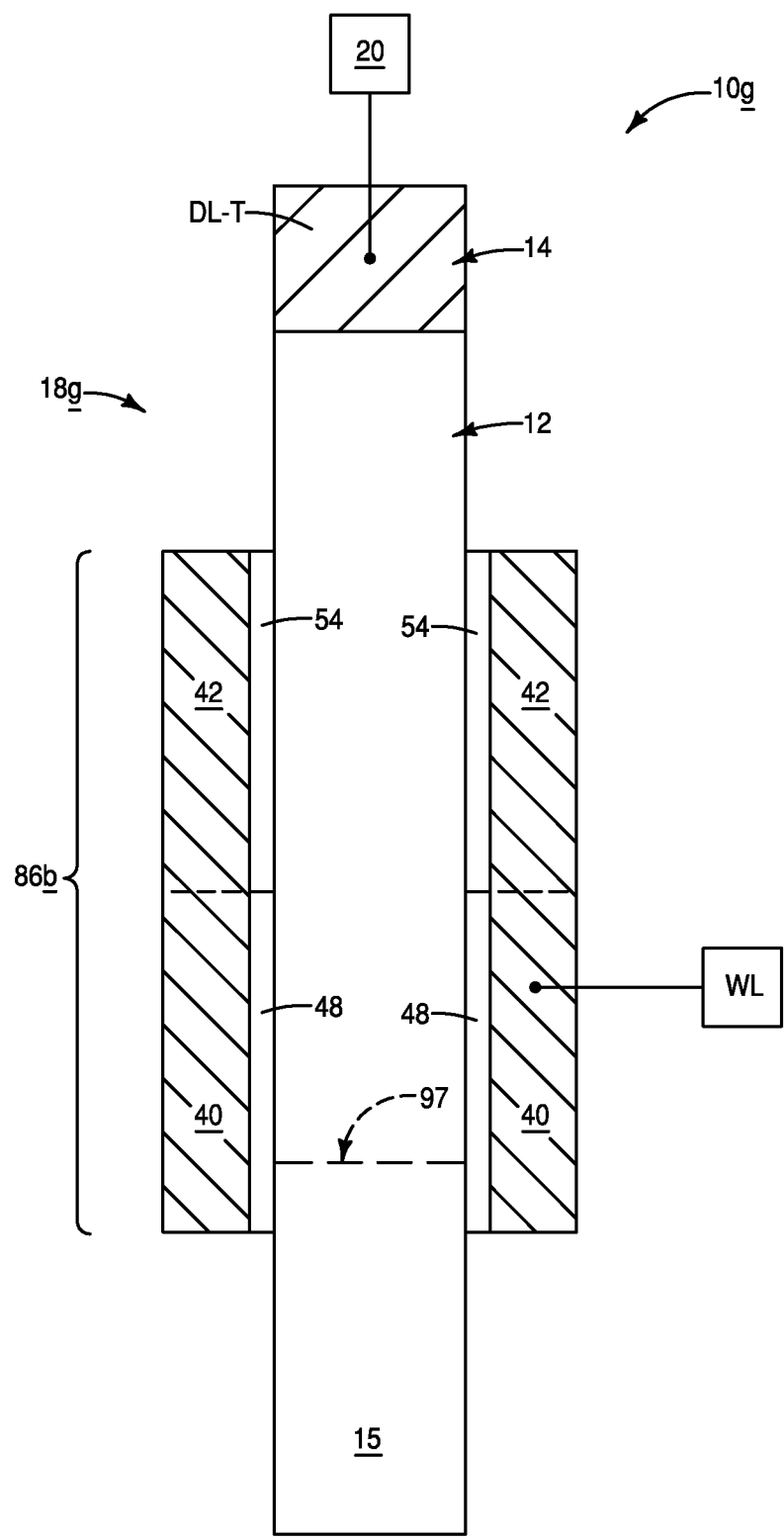

FIGS. 13 and 13A show an assembly 10g comprising a memory cell 18g analogous to the memory cell 18f of FIGS. 12 and 12A, but in which the first conductive line 100 is directly against the second conductive line 102. The lines 100 and 102 are together comprised by a single conductive structure 86b analogous the structure 86 described above with reference to FIG. 9. The structure 86b comprises the gate material 40 of the ferroelectric transistor, and the gate material 42 of the non-ferroelectric transistors. The structure 86b may comprise a single uniform composition throughout (e.g., the gate materials 40 and 42 may be identical in composition relative to one another), or may comprise multiple compositions (e.g., the gate materials 40 and 42 may be different from one another). In some embodiments, the compositions of the non-ferroelectric-transistor-gate material 42 and the ferroelectric-transistor-gate material 40 may be optimized relative to another. In other embodiments, the materials 40 and 42 are identical to one another in order to simplify fabrication of the conductive structure 86a.

The memory cell 18g of FIGS. 13 and 13A may be operated analogously to the memory cell 18b of FIG. 4. Accordingly, the memory cell 18g may be incorporated into a memory array 82 of the type described above with reference to FIG. 5.

The assemblies and structures discussed above may be utilized within any suitable integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a semiconductor structure coupled with a conductive structure. A ferroelectric transistor includes a first transistor gate adjacent a first region of the semiconductor structure. A non-ferroelectric transistor includes a second transistor gate adjacent a second region of the semiconductor structure. The second region of the semiconductor structure is between the first region of the semiconductor structure and the conductive structure.

Some embodiments include an integrated assembly having a semiconductor structure extending from a first wiring to a second wiring. A ferroelectric transistor includes a first transistor gate adjacent a first region of the semiconductor structure. A first non-ferroelectric transistor includes a second transistor gate adjacent a second region of the semiconductor structure. The second region of the semiconductor structure is between the first region of the semiconductor structure and the first wiring. A second non-ferroelectric transistor includes a third transistor gate adjacent a third region of the semiconductor structure. The third region of the semiconductor structure is between the first region of the semiconductor structure and the second wiring.

Some embodiments include an integrated assembly having a first comparative digit line over a second comparative digit line. A semiconductor pillar extends from the first comparative digit line to the second comparative digit line. A first non-ferroelectric transistor is under the first comparative digit line and gates an upper region of the semiconductor pillar. A ferroelectric transistor is under the first non-ferroelectric transistor and gates a middle region of the semiconductor pillar. A second non-ferroelectric transistor is under the ferroelectric transistor and gates a lower region of the semiconductor pillar.

Some embodiments include an integrated assembly having a first comparative digit line laterally offset from a second comparative digit line. A semiconductor structure extends from the first comparative digit line to the second comparative digit line. The semiconductor structure has a first stem extending downwardly from the first comparative digit line, a second stem extending downwardly from the second comparative digit line, and a segment extending from the first stem to the second stem. A trough is defined between the first and second stems, and over the segment. A first non-ferroelectric transistor is under the first comparative digit line and gates an upper region of the first stem. A second non-ferroelectric transistor is under the second comparative digit line and gates an upper region of the second stem. A ferroelectric configuration is under the first and second non-ferroelectric transistors and gatedly couples lower regions of the first and second stems to one another through a body region that extends along the segment.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. An integrated assembly, comprising:
   a semiconductor structure coupled with a conductive structure;
   an insulative structure lining an entirety of a vertical sidewall surface of the semiconductor structure, the insulative structure having a first portion comprising a ferroelectric material and a second portion comprising an insulative material, the ferroelectric material being in direct physical contact with the insulative material;
   a ferroelectric transistor comprising a first transistor gate along a first region of the semiconductor structure and spaced from the first region by the ferroelectric material; and
   a non-ferroelectric transistor comprising a second transistor gate adjacent along a second region of the semiconductor structure and spaced from the second region by the insulative material; the second region of the semiconductor structure being between the first region of the semiconductor structure and the conductive structure.

2. The integrated assembly of claim 1 wherein the first region is a same composition as the second region.

3. The integrated assembly of claim 1 wherein the first region is a different composition relative to the second region.

4. The integrated assembly of claim 1 wherein the first and second transistor gates are vertically spaced from one another.

5. The integrated assembly of claim 4 wherein the first and second transistor gates are coupled to different voltage sources relative to one another.

6. The integrated assembly of claim 4 wherein the first and second transistor gates are coupled to a common voltage source.

7. The integrated assembly of claim 1 wherein a single conductive structure comprises the first and second transistor gates.

8. The integrated assembly of claim 7 wherein said single conductive structure has a region of the first transistor gate which is different in composition relative to a region of the second transistor gate directly against said region of the first transistor gate.

9. An integrated assembly, comprising:
   a semiconductor structure extending from a first wiring to a second wiring;
   a ferroelectric transistor comprising a first transistor gate adjacent a first region of the semiconductor structure;
   a first non-ferroelectric transistor comprising a second transistor gate adjacent a second region of the semiconductor structure; the second region of the semiconductor structure being between the first region of the semiconductor structure and the first wiring; and
   a second non-ferroelectric transistor comprising a third transistor gate adjacent a third region of the semiconductor structure; the third region of the semiconductor structure being between the first region of the semiconductor structure and the second wiring; and
   wherein:
   the first transistor gate is spaced from the first region by a first intervening region comprising ferroelectric material;
   the second transistor gate is spaced from the second region by a second intervening region comprising first insulative material;
   the third transistor gate is spaced from the third region by a third intervening region comprising second insulative material;
   an upper portion of the ferroelectric material abuts directly against the first insulative material; and
   a lower portion of the ferroelectric material abuts directly against the second insulative material.

10. The integrated assembly of claim 9 wherein the first, second and third transistor gates are coupled with a common voltage source.

11. The integrated assembly of claim 9 wherein the second and third transistor gates are coupled with a common voltage source, and wherein the first transistor gate is coupled with another voltage source which is different from said common voltage source.

12. The integrated assembly of claim 9 wherein the first and second wirings are first and second digit lines which are comparatively coupled to one another through a sense amplifier.

13. The integrated assembly of claim 12 being one of many substantially identical memory cells within a memory array.

14. The integrated assembly of claim 9 wherein the second region is over the first region, which in turn is over the third region.

15. The integrated assembly of claim 9 wherein the first region is directly against the second region, and is directly against the third region.

16. The integrated assembly of claim 9 wherein:
   the first region of the semiconductor structure is between first and second source/drain sections;
   the second region of the semiconductor structure is between third and fourth source/drain sections;
   the third region of the semiconductor structure is between fifth and sixth source/drain sections;
   the first source/drain section is coupled with the fourth source/drain section;
   the second source/drain section is coupled with the fifth source/drain section;
   the third source/drain section is coupled with the first wiring; and
   the sixth source/drain section is coupled with the second wiring.

17. The integrated assembly of claim 9 wherein the first, second and third regions of the semiconductor structure comprise a same composition as one another.

18. The integrated assembly of claim 9 wherein at least one of the first, second and third regions of the semiconductor structure comprises a different composition relative to another the first, second and third regions of the semiconductor structure.

19. An integrated assembly, comprising:
a first comparative digit line over a second comparative digit line;
a semiconductor pillar extending from the first comparative digit line to the second comparative digit line;
a first non-ferroelectric transistor under the first comparative digit line and gating an upper region of the semiconductor pillar, the first non-ferroelectric transistor comprising a first gate spaced from the upper region of the semiconductor material by a first insulative material;
a ferroelectric transistor under the first non-ferroelectric transistor and gating a middle region of the semiconductor pillar, the ferroelectric transistor comprising a second gate spaced from the middle region of the semiconductor material by a ferroelectric material; and
a second non-ferroelectric transistor under the ferroelectric transistor and gating a lower region of the semiconductor pillar, the second non-ferroelectric transistor comprising a third gate spaced from the lower region of the semiconductor material by a second insulative material, the ferroelectric material being in direct physical contact with each of the first and second insulative materials.

20. The integrated assembly of claim 19 wherein:
the first non-ferroelectric transistor comprises a first transistor gate;
the second non-ferroelectric transistor comprises a second transistor gate;
the ferroelectric transistor comprises a third transistor gate; and
the first, second and third transistor gates are vertically spaced from one another.

21. The integrated assembly of claim 19 wherein:
the first non-ferroelectric transistor comprises a first transistor gate;
the second non-ferroelectric transistor comprises a second transistor gate;
the ferroelectric transistor comprises a third transistor gate; and
a single conductive structure comprises the first, second and third transistor gates.

22. The integrated assembly of claim 21 wherein said single conductive structure has a region of the third transistor gate which is different in composition relative to regions of the first and second transistor gates directly against said region of the third transistor gate.

23. The integrated assembly of claim 19 wherein:
the first non-ferroelectric transistor comprises a first transistor gate;
the second non-ferroelectric transistor comprises a second transistor gate;
the ferroelectric transistor comprises a third transistor gate; and
the first, second and third transistor gates are coupled with a common voltage source.

24. The integrated assembly of claim 19 wherein:
the first non-ferroelectric transistor comprises a first transistor gate;
the second non-ferroelectric transistor comprises a second transistor gate;
the ferroelectric transistor comprises a third transistor gate;
the first and second transistor gates are coupled with a common voltage source; and
the third transistor gate is coupled with another voltage source which is different from said common voltage source.

25. The integrated assembly of claim 24 configured to refresh the first and second non-ferroelectric transistors to remove excess charge buildup along channel regions associated with the first and second non-ferroelectric transistors.

26. The integrated assembly of claim 19 being configured as one of many substantially identical memory cells within a memory array.

* * * * *